US007018548B2

(12) United States Patent
Kamijima

(10) Patent No.: US 7,018,548 B2
(45) Date of Patent: Mar. 28, 2006

(54) CONDUCTIVE THIN FILM PATTERN AND METHOD OF FORMING THE SAME, METHOD OF MANUFACTURING THIN FILM MAGNETIC HEAD, METHOD OF MANUFACTURING THIN FILM INDUCTOR, AND METHOD OF MANUFACTURING MICRO DEVICE

(75) Inventor: Akifumi Kamijima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 256 days.

(21) Appl. No.: 10/617,131

(22) Filed: Jul. 11, 2003

(65) Prior Publication Data
US 2004/0013793 A1 Jan. 22, 2004

(30) Foreign Application Priority Data
Jul. 19, 2002 (JP) ............................ 2002-211670

(51) Int. Cl.
*H01L 21/027* (2006.01)
(52) U.S. Cl. .............................. 216/2; 216/13; 216/17; 216/18; 216/22; 216/41; 216/47; 216/49; 216/75; 216/100; 29/603.07; 205/122; 205/123; 205/170; 430/312; 430/318; 438/702
(58) Field of Classification Search ..................... None
See application file for complete search history.

(56) References Cited
U.S. PATENT DOCUMENTS
3,853,715 A  12/1974  Romankiw

| 6,156,487 | A  | * | 12/2000 | Jennison et al. | ............ | 430/316 |
| 6,641,984 | B1 | * | 11/2003 | Kamijima | ................... | 430/320 |
| 6,721,130 | B1 | * | 4/2004 | Kobayashi et al. | ......... | 360/123 |
| 6,780,738 | B1 | * | 8/2004 | Kamijima | ................... | 438/579 |
| 6,922,316 | B1 | * | 7/2005 | Sato et al. | .................. | 360/317 |
| 2002/0054460 | A1 | * | 5/2002 | Takahashi et al. | .......... | 360/313 |

FOREIGN PATENT DOCUMENTS

| JP | B 56-36706 | | 8/1981 |
| JP | A 8-330736 | | 12/1996 |
| JP | 09073608 A | * | 3/1997 |
| JP | A 2003-29415 | | 1/2003 |

\* cited by examiner

*Primary Examiner*—Anita Alanko
(74) *Attorney, Agent, or Firm*—Oliff & Berridge, PLC

(57) ABSTRACT

A high-precision conductive thin film pattern having a high aspect ratio and a method of forming the same are provided. Further, a method of manufacturing a thin film magnetic head, a thin film inductor, and a micro device each including such a conductive thin film pattern is provided. Since a stacked layer structure including two conductive layer patterns formed by plating growth using an underfilm pattern as an electrode film and an intermediate conductive layer pattern sandwiched by the two conductive layer patterns is provided, a thicker conductive thin film pattern is obtained. An intermediate conductive layer covering a first resist frame is formed and, after that, a second resist frame is formed in a position corresponding to the first resist frame. Consequently, without causing inter-mixing, the first and second resist frames can be stacked. Thus, a thicker conductive thin film pattern can be formed easily with high precision.

14 Claims, 9 Drawing Sheets

CONDUCTIVE THIN FILM PATTERN AND METHOD OF FORMING THE SAME, METHOD OF MANUFACTURING THIN FILM MAGNETIC HEAD, METHOD OF MANUFACTURING THIN FILM INDUCTOR, AND METHOD OF MANUFACTURING MICRO DEVICE

BACKGROUND OF THE INVENTION

1. Field of the Invention

The present invention relates to a conductive thin film pattern formed on a substrate and a method of forming the same, a method of manufacturing a thin film magnetic head including the conductive thin film pattern, a method of manufacturing a thin film inductor, and a method of manufacturing a micro device.

2. Description of the Related Art

Hitherto, as communication path means for passing current in an electronic/magnetic device formed by using a thin film process, a conductive thin film pattern is often used. For example, a metal thin film coil is used in a thin film magnetic head or a thin film inductor, and a metal wiring pattern is used in a semiconductor device.

As a method of forming a conductive thin film pattern of this kind on a substrate, a so-called frame plating method is known. According to the method, a resist frame having a desired opening pattern shape made by a photoresist or the like is formed on an underfilm formed on a substrate. After that, electroplating is performed by using the underfilm in an opening in the resist frame as an electrode film, thereby growing a plating film on the underfilm to form a conductive thin film pattern. This method is disclosed in, for example, Japanese Patent Publication No. Sho 56-36706.

In recent years, to reduce the size of such a device, a reduction in the size of the conductive thin film pattern is being demanded. In this case, to reduce the size in plan view of the conductive thin film pattern without deteriorating the performance of the device, it is necessary to assure a sufficiently large section area orthogonal to the current direction of the conductive thin film pattern. As a result, a higher aspect ratio is requested. The aspect ratio denotes the ratio of height to width in a rectangular cross section.

To obtain a higher aspect ratio, the thickness of the frame resist has to be increased. From a viewpoint of a forming process, the thickness of a resist layer is limited and, as a result, a conductive thin film pattern having a sufficient height is not obtained for the following reason. If a resist layer is formed very thick, in a photolithography process, at the time of development of dissolving and removing the portion inside the frame, a problem occurs such that the resist frame is partly destroyed, and a high-precision pattern cannot be formed.

To deal with the problem, a method of obtaining a conductive thin film pattern having a high aspect ratio by repeating a frame plating process a plurality of times to stack a plurality of conductive thin film patterns (hereinbelow, called repetitive frame plating method) has been proposed. According to the method, even if a pattern formed by the frame plating process of once is thin, a cross section shape having a large height is obtained as a whole stack body obtained by repeating the process a plurality of times. As a result, a high aspect ratio can be obtained.

A method of forming a resist frame in the frame plating method includes a method of using a liquid photoresist as a photoresist layer (hereinbelow, called a liquid resist method) and a method of using a dry film photoresist as a photoresist layer (hereinbelow, called a dry resist method). The liquid resist method is a method of forming a resist frame pattern by applying a liquid photoresist material, curing the material, performing selective exposure with an exposure mask, and performing development of dissolving and removing an unnecessary resist portion. The dry resist method is a method of forming a resist frame pattern by adhering a film resist in a sheet shape onto the underfilm and performing exposure and development similar to the above. The method is disclosed in, for example, Japanese Unexamined Patent Publication No. Hei 8-330736.

In the case of applying the liquid resist method to the repetitive frame plating method, high-resolution patterning is possible, however, the following problem occurs. When a liquid photoresist layer as a resist frame of a second layer is formed on a resist frame as a first layer, inter-mixing occurs between the first and second layers (a phenomenon that the resist frame as the first layer is re-dissolved and is mixed with the resist layer as the second layer) and the shape of the resist pattern is lost. As a result, it is difficult to form a resist frame having high dimensional precision.

On the other hand, according to the dry resist method, the possibility of occurrence of inter-mixing at the time of forming the frame resist as the second layer is low. However, it is difficult to carry out patterning with high resolution. Consequently, the pattern pitch of the resist frame obtained is limited and it is difficult to realize the pattern pitch of about 100 μm or less.

SUMMARY OF THE INVENTION

The invention has been achieved in consideration of the problems and a first object of the invention is to provide a high-precision conductive thin film pattern having a high aspect ratio and a method of manufacturing the same. A second object of the invention is to provide a method of manufacturing a thin film magnetic head, a thin film inductor, and a micro device each including such a conductive thin film pattern.

A method of forming a conductive thin film pattern according to the invention includes: a first step of forming an underfilm made of a conductor on a substrate; a second step of selectively forming a first resist frame on the underfilm; a third step of forming a first conductive layer pattern by making selective plating growth using the first resist frame as a mask and using the underfilm as an electrode film occur; a fourth step of forming an intermediate conductive layer so as to cover the first resist frame and the first conductive layer pattern; a fifth step of selectively forming a second resist frame in a position corresponding to the first resist frame on the intermediate conductive layer; a sixth step of forming a second conductive layer pattern by making selective plating growth using the second resist frame as a mask and using the intermediate conductive layer as an electrode film occur; and a seventh step of completing formation of the conductive thin film pattern by removing the first and second resist frames, the intermediate conductive layer in a portion sandwiched by the resist frames, and the underfilm.

According to the invention, there is provided a method of manufacturing a thin film magnetic head, a thin film inductor, and a micro device, wherein a step of forming a conductive thin film pattern includes: a first step of forming an underfilm made of a conductor on a substrate; a second step of selectively forming a first resist frame on the underfilm; a third step of forming a first conductive layer pattern by making selective plating growth using the first resist frame as a mask and using the underfilm as an electrode film occur; a fourth step of forming an intermediate conductive layer so as to cover the first resist frame and the first conductive layer pattern; a fifth step of selectively forming a second resist frame in a position corresponding to the first resist frame on the intermediate conductive layer; a sixth step of forming a second conductive layer pattern by making selective plating growth using the second resist frame as a mask and using the intermediate conductive layer as an electrode film occur; and a seventh step of completing formation of the conductive thin film pattern by removing the first and second resist frames, the intermediate conductive layer in a portion sandwiched by the resist frames, and the underfilm. The micro device includes all of devices including a conductive thin film pattern such as electron/magnetic devices and a micro machine ranging from a nano meter scale typified by a quantum-effect device to a micro meter order.

In the method of forming a conductive thin film pattern, the method of manufacturing a thin film magnetic head, the method of manufacturing a thin film inductor, and the method of manufacturing a micro device, before the second resist frame is formed, the intermediate conductive layer is formed so as to cover the first resist frame. Consequently, the second resist frame can be formed without causing inter-mixing with the first resist frame. Therefore, a plurality of resist frames having the same pattern shape can be easily stacked with high precision, and a conductive thin film pattern thicker than that in the case of a single-layer structure can be formed with high precision.

The method of forming a conductive thin film pattern of the invention is particularly effective in the case where at least the second resist frame is formed by using a liquid photoresist material for the reason that the liquid photoresist material is easily inter-mixed with the first resist frame. In the case where a liquid photoresist material is used as the material of the first and second resist frames, high resolution is obtained, so that an extremely fine pattern can be formed and a high aspect ratio can be achieved. In the fourth step, the intermediate conductive layer may be formed by using a material having the same composition as that of at least one of the first and second conductive layer patterns or by using a different material.

In the method of manufacturing a thin film magnetic head according to the invention, by using the step of forming the conductive thin film pattern, a thin film coil for generating a signal magnetic field for performing magnetic recording or a wiring pattern functioning as a conductive lead can be formed.

A conductive thin film pattern of the invention has: an underfilm pattern made of a conductor; a first conductive layer pattern formed by selective plating growth using the underfilm pattern as an electrode film on the underfilm pattern; an intermediate conductive layer pattern formed on the first conductive layer pattern; and a second conductive layer pattern formed by selective plating growth using the intermediate conductive layer pattern as an electrode film on the intermediate conductive layer pattern.

The conductive thin film pattern of the invention has a stacked-layer structure including two conductive layer patterns formed by plating growth on an underfilm pattern made of a conductor, and an intermediate conductive layer pattern sandwiched by the two conductive layer patterns. Consequently, a plating film pattern which is generally thicker as compared with the case of a single-layer structure can be obtained. The intermediate conductive layer pattern may be made of a material having the same composition as that of at least one of the first and second conductive layer patterns or a different material.

Other and further objects, features and advantages of the invention will appear more fully from the following description.

DETAILED DESCRIPTION OF THE PREFERRED EMBODIMENTS

Embodiments of the invention will be described in detail hereinbelow with reference to the drawings.

First Embodiment

First, with reference to FIGS. 1 to 4, a thin film magnetic head to which a conductive thin film pattern according to a first embodiment of the invention is applied will be described.

A thin film magnetic head according to the embodiment includes a coil as a conductive thin film pattern formed on a substrate. The coil portion will be described in detail later and, first, a schematic configuration of the thin film magnetic head will be described hereinbelow.

Figure 1:
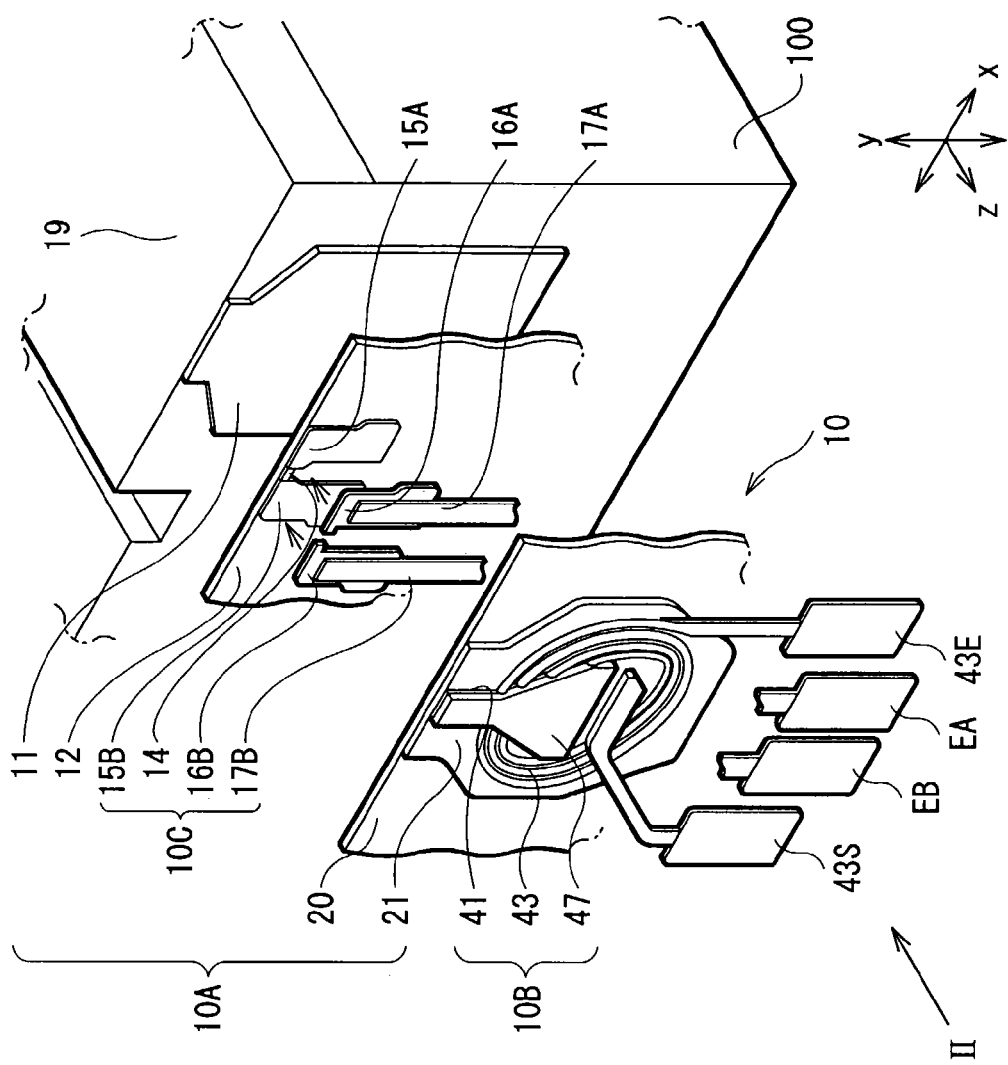
FIG. 1 is an exploded perspective view showing the configuration of a thin film magnetic head according to an embodiment of the invention.
Figure 2:
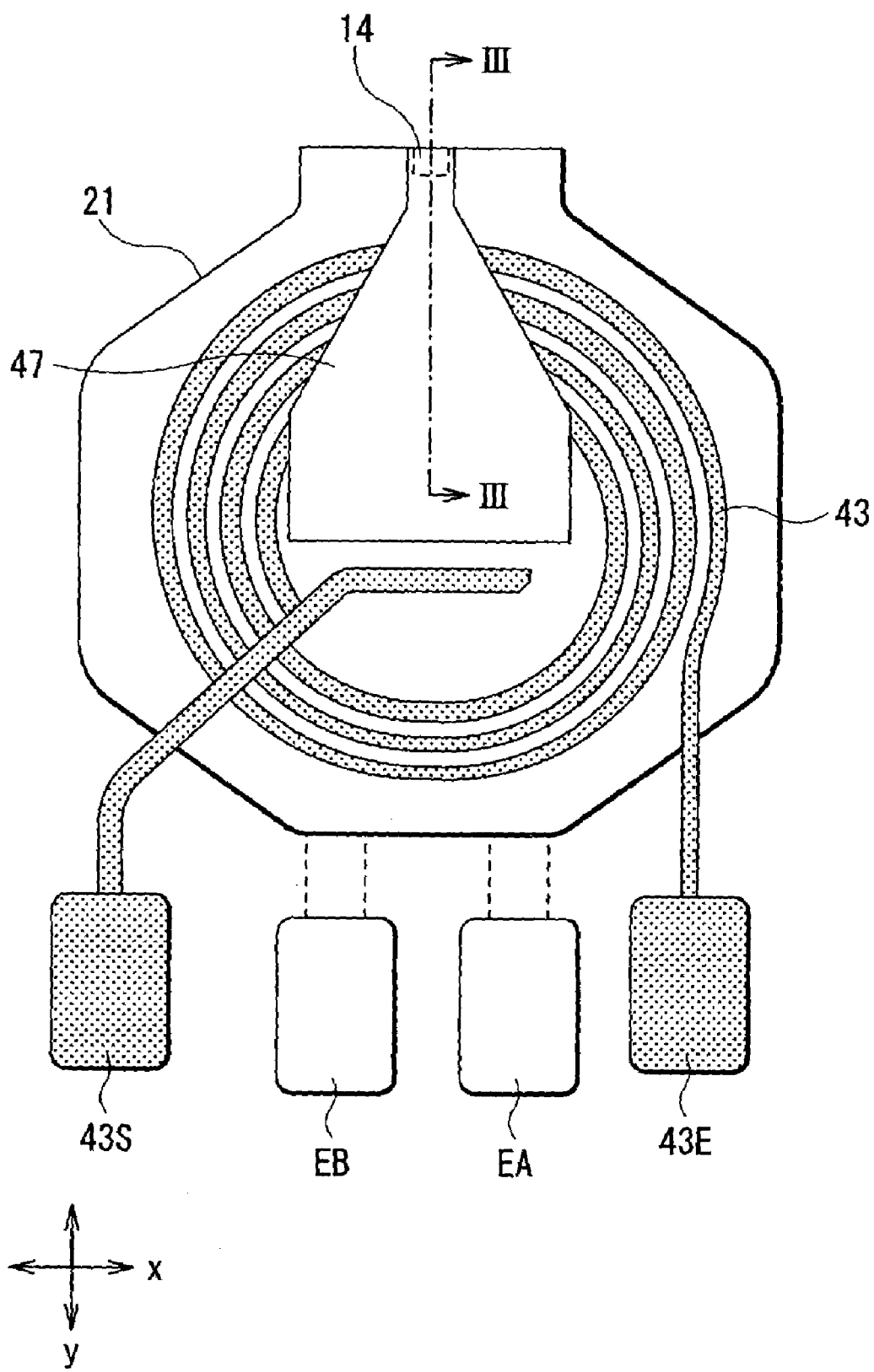
FIG. 2 is a plan view showing a structure seen from the direction of the arrow II of the thin film magnetic head illustrated in FIG. 1.
Figure 3:
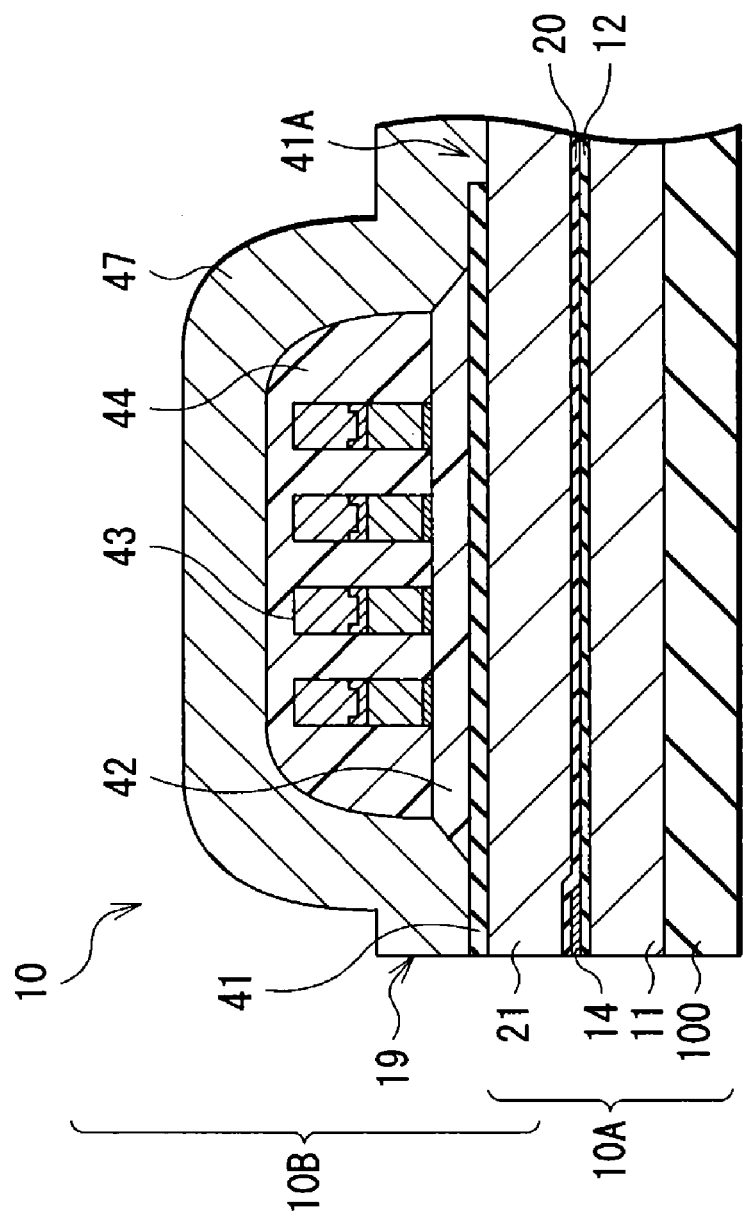
FIG. 3 is a cross section showing a structure taken along line III—III of FIG. 2 of the thin film magnetic head illustrated in FIG. 1.

FIG. 1 is an exploded perspective view showing a structure of a thin film magnetic head 10 formed on a side face of a slider in a magnetic head apparatus. FIG. 2 is a plan view seen from the direction of arrow II shown in FIG. 1. FIG. 3 is a cross section taken along line III—III of FIG. 2. As shown in FIGS. 1 and 3, the thin film magnetic head 10 is integrally constructed by sequentially stacking a reproducing head portion 10A and a recording head portion 10B from the side close to a base 100 of a slider. The reproducing head portion 10A is to reproduce magnetic information recorded on a magnetic recording medium. The recording head portion 10B is to record magnetic information onto a magnetic recording medium.

The reproducing head portion 10A has, on the side where it is exposed to an air bearing surface (ABS) 19 as shown in FIGS. 1 and 3, for example, a structure in which a bottom shield layer 11, a bottom gap layer 12, a magnetoresistive (MR) device 10C, a top gap layer 20, and a top shield layer 21 are sequentially stacked on the base 100.

The bottom shield layer 11 is made of, for example, a magnetic material such as a nickel iron alloy (NiFe) and has the function of preventing an unnecessary magnetic field from being influenced on an MR film 14 which will be described later. The bottom gap layer 12 is made of an insulating material such as aluminum oxide ($Al_2O_3$) or aluminum nitride (AlN) and is to obtain insulation between the bottom shield layer 11 and the MR film 14. The MR device 10C includes the MR film 14, a pair of magnetic domain control layers 15A and 15B (hereinbelow, generically called "magnetic domain control layers 15") extending on both sides of the MR film 14, a pair of lead layers 16A and 16B (hereinbelow, generically called "first lead layers 16") formed on the magnetic domain control layers 15, and a pair of second lead layers 17A and 17B (hereinbelow, generically called "second lead layers 17") selectively formed on the first lead layers 16. The top gap layer 20 is made of an insulating material similar to that of the bottom gap layer 12 and is to provide insulation between the top shield layer 21 and the MR film 14. The top shield layer 21 is made of a magnetic material such as a nickel iron alloy (NiFe) like the bottom shield layer 11 and is also used to prevent an unnecessary magnetic field from being exerted on the MR film 14. The top shield layer 21 also has the function of a bottom pole in the recording head portion 10B. Besides the top shield layer 21, a bottom pole may be independently constructed.

The MR film 14 is a spin valve MR film having a multilayer structure including a magnetic material and has the function of reading information recorded on a magnetic recording medium (not shown). The bottom face of the MR film 14 is in contact with the bottom gap layer 12 and the top face is in contact with the top gap layer 20. The reproducing head portion 10A reproduces information recorded on the magnetic recording medium by using a phenomenon that electric resistance of the MR film 14 changes according to a signal magnetic field from the magnetic recording medium. The MR film 14 is not always limited to the spin valve MR film but may be, for example, a tunneling magnetoresistive film.

The pair of magnetic domain control layers 15 and the pair of first lead layers 16 are sequentially stacked on the bottom gap layer 12 on both sides of the MR film 14 as shown in FIG. 1. The magnetic domain control layers 15 are made of a hard magnetic material including a cobalt platinum (CoPt) alloy and extend on both sides in the direction corresponding to the recording track width direction of the MR film 14. The magnetic domain control layers 15 functions to suppress occurrence of Barkhausen noise by aligning orientations of magnetic domains of a magnetic free layer (not shown) included in the MR film 14 to make a single magnetic domain. The first lead layers 16 function as a current path for passing a sense current to the MR film 14 via the magnetic domain control layers 15 and are connected to electrodes EA and EB via the second lead layers 17 as shown in FIGS. 1 and 2.

In the reproducing head portion 10A having such a configuration, the magnetization direction of the magnetic free layer of the MR film 14 changes according to a signal magnetic field from the magnetic recording medium. Consequently, a change occurs relative to the magnetization direction of a magnetization pinned layer (not shown) included in the MR film 14. When a current is passed into the MR film 14 at this time, a change in the magnetization direction appears as a change in magnetic resistance. By using the phenomenon, a signal magnetic field is detected and magnetic information is reproduced.

Next, the configuration of the recording head 10B will be described. As shown in FIGS. 1 to 3, the recording head portion 10B has the top shield layer 21 also functioning as a bottom pole, a recording gap layer 41, a photoresist layer 42, a coil 43, a photoresist layer 44, and a top pole 47.

The recording gap layer 41 is made of an insulating material such as aluminum oxide and is formed on the top shield layer 21. The recording gap layer 41 has an opening 41A in a position corresponding to the center portion of the coil 43 (refer to FIG. 3) in order to form a magnetic path. The coil 43 is formed so as to have a spiral shape in plan view around the opening 41A as a center via the photoresist layer 42. Further, the photoresist layer 44 is formed in a predetermined pattern so as to cover the coil 43. The photoresist layers 42 and 44 are cured by heating treatment. Terminals of the coil 43 are connected to electrodes 43S and 43E (refer to FIGS. 1 and 2).

On the recording gap layer 41, opening 41A, and photoresist layers 42 and 44, for example, the top pole 47 made of a magnetic material having high saturation flux density such as an NiFe alloy or iron nitride (FeN) is formed. The top pole 47 is in contact with and magnetically connected to the top shield layer 21 via the opening 41A. Although not shown, an overcoat layer made of aluminum oxide or the like is formed so as to cover the whole top face of the recording head portion 10B.

The recording head portion 10B having such a configuration generates a magnetic flux into a magnetic path constructed by including the top shield layer 21 and the top pole 47 by a current flowing in the coil 43 to magnetize a magnetic recording medium 1 by a signal magnetic field generated near the recording gap layer 41 and record information.

Figure 4:
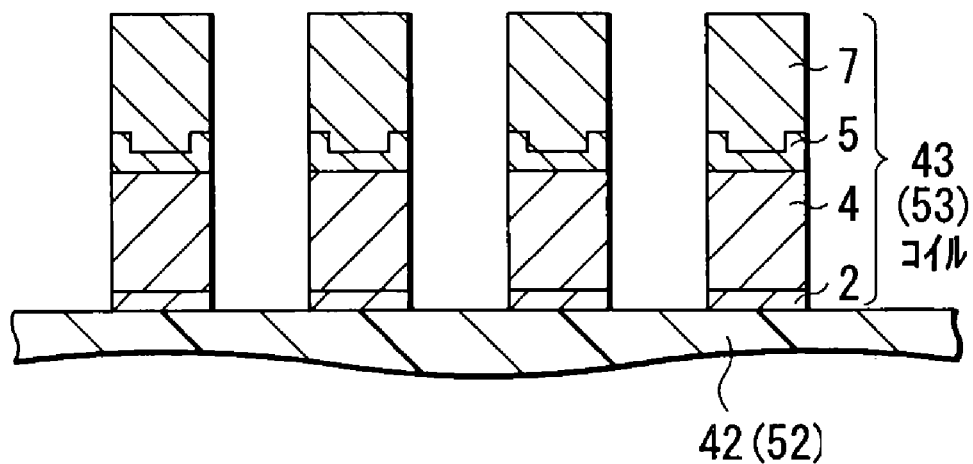
FIG. 4 is an enlarged cross section showing a part of the structure taken along line III—III of FIG. 2 of the thin film magnetic head illustrated in FIG. 1.

Referring now to FIGS. 3 and 4, the configuration of the coil 43 as an important characteristic portion of the invention will be described in detail. FIG. 4 enlargedly shows the portion around the coil 43 in the cross section of the thin film magnetic head 10 illustrated in FIG. 3.

The coil 43 of the embodiment is formed on the photoresist layer 42 and has a stacked-layer structure. The photoresist layer 42 corresponds to an example of "substrate" in the invention and the coil 43 corresponds to an example of "conductive thin film pattern" in the invention. The coil 43 has, as shown in FIG. 4, an underfilm pattern 2 made of a conductor, a first conductive layer pattern 4 formed by selective plating growth using the underfilm pattern 2 as an electrode film, an intermediate conductive layer pattern 5 formed on the first conductive layer pattern 4, and a second conductive layer pattern 7 formed by selective plating growth using the intermediate conductive layer pattern 5 as an electrode film. The coil 43 can be formed so that the aspect ratio of a rectangular cross section in the stack direction becomes 3 or higher.

The first and second conductive layer patterns 4 and 7 are made of, for example, copper (Cu), gold (Au), or platinum (Pt). Each of the first and second conductive layer patterns 4 and 7 has, for example, a thickness of 50 μm. The intermediate conductive layer pattern 5 is made of a conductor which can be formed by a dry thin-film forming process such as sputtering or CVD and, particularly, may be made of the material having the same composition as that of at least one of the first and second conductive layer patterns 4 and 7 or a material different from that of each of the first and second conductive layer patterns 4 and 7. The intermediate conductive layer pattern 5 has, for example, a thickness of 100 nm. The intermediate conductive layer pattern 5 may have a single-layer structure or a stacked-layer structure of two or more layers. The underfilm pattern 2 is made of a conductor which can be formed by a dry thin-film forming process such as sputtering or CVD like the intermediate conductive layer pattern 5 and, particularly, may be made of the material having the same composition as that of at least one of the first and second conductive layer patterns 4 and 7 or a material different from that of each of the first and second conductive layer patterns 4 and 7.

With the configuration, the coil 43 has a stacked-layer structure including the first and second conductive layer patterns 4 and 7 formed by plating growth and the intermediate conductive layer pattern 5 sandwiched by the patterns 4 and 7 on the underfilm pattern 2 made of a conductor. Consequently, the thickness larger than that in the case of the single-layer structure which does not include the intermediate conductive layer pattern 5 can be easily obtained. The reason will be described in detail later.

A method of manufacturing a thin film magnetic head according to the embodiment will now be described. A "method of forming a conductive thin film pattern" of the invention corresponds to processes as a part of the method of manufacturing a thin film magnetic head according to the embodiment, so that it will be also described hereinbelow.

First, with reference to FIGS. 1 to 3, a method of manufacturing the thin film magnetic head 10 will be described generally.

First, the bottom shield layer 11 made of a conductive magnetic material such as nickel iron (NiFe) alloy is formed by sputtering or the like on the substrate as the base 100. After that, the bottom gap layer 12 made of aluminum oxide or the like is formed on the bottom shield layer 11. Subsequently, a multilayer film serving as the MR film 14 having the spin valve structure is formed on the bottom gap layer 12. Concretely, by using sputtering or the like, an underlayer, a pinning layer, a pinned layer, a non-magnetic layer, a magnetic free layer, and a protection layer (which are not shown) are sequentially stacked. Subsequently, the multilayer film is selectively etched by processing such as patterning by photolithography and ion milling, thereby forming the MR film 14. After that, the pair of magnetic domain control layers 15 (15A and 15B) are formed on the bottom gap layer 12 so as to face each other over the MR film 14. Further, on the magnetic domain control layers 15, the first lead layers 16 (16A and 16B) and the second lead layers 17 (17A and 17B) are sequentially formed. After that, the top gap layer 20 is formed by, for example, sputtering so as to cover the bottom gap layer 12, magnetic domain control layers 15, first lead layers 16, second lead layers 17, and MR film 14. On the top gap layer 20, the top shield layer 21 made of a conductive magnetic material such as an NiFe alloy is selectively formed.

By the above operation, formation of the reproducing head portion 10A having the spin valve MR film 14, the magnetic domain control layers 15, and the path for passing current in the direction perpendicular to the film formation face of the MR film 14 (specifically, the top shield layer 21, top gap layer 20, bottom gap layer 12, and bottom shield layer 11 is completed.

Subsequently, on the reproducing head portion 10A, the recording head portion 10B is formed. Concretely, first, the recording gap layer 41 made of an insulating material is selectively formed by sputtering or the like on the top shield layer 21. After that, by partially etching the recording gap layer 41, the opening 41A for forming a magnetic path is formed.

After that, the photoresist layer 42 is formed in a predetermined pattern on the recording gap layer 41 and is cured by heating treatment, and the coil 43 having a spiral shape around the opening 41A as a center is formed. A method of forming the coil 43 will be described in detail hereinlater. The photoresist layer 44 which determines the throat height is formed in a predetermined pattern so as to cover the coil 43 and cured by the heating treatment. The throat height denotes a distance from the front end of the photoresist layer 44 in which the coil 43 is buried to the ABS 19. After that, a coil and a photoresist layer may be repeatedly formed on the photoresist layer 44. In the embodiment, to simplify the description, only one layer of the coil is formed.

After forming the photoresist layer 44, the top pole 47 is selectively formed on the recording gap layer 41, the opening 41A and the photoresist layer 44. The top pole 47 is used as a mask and the recording gap layer 41 is selectively etched by ion milling or the like. Further, a not-shown resist layer is formed. By using the resist layer and the top pole 47 as a mask, the top shield layer 21 is selectively etched to a predetermined depth in a region near the region in which the ABS 19 is formed. It completes formation of the recording head portion 10B.

Finally, a not-shown overcoat layer made of an insulating material such as aluminum oxide is formed so as to cover all of structures including the top pole 47. In such a manner, formation of the thin film magnetic head 10 having the reproducing head portion 10A and the recording head portion 10B is completed.

Subsequently, by referring to FIGS. 4 to 15, a method of forming the coil 43 included in the recording head portion 10B as an important characteristic part in the embodiment will be described in detail. FIGS. 5 to 15 are enlarged cross sections each showing a process step for forming the coil 43 illustrated in FIG. 4.

The process of forming the coil 43 includes a first step of forming an underfilm 2A made of a conductor on a substrate, a second step of selectively forming a first resist frame 3 on the underfilm 2A, a third step of forming the first conductive layer pattern 4 by making selective plating growth using the first resist frame 3 as a mask and using the underfilm 2A as an electrode film occur, a fourth step of forming an intermediate conductive layer 5A so as to cover the first resist frame 3 and the first conducive layer pattern 4, a fifth step of selectively forming a second resist frame 6 in a position corresponding to the first resist frame 3 on the intermediate conductive layer 5A, a sixth step of forming the second conductive layer pattern 7 by making selective plating growth using the second resist frame 6 as a mask and using the intermediate conductive layer 5A as an electrode film occur, and a seventh step of removing the first and second resist frames 3 and 6, the intermediate conductive layer 5A sandwiched by the first and second resist frames 3 and 6, and the underfilm 2A. Each of the steps will be described in more detail hereinbelow.

Figure 5:
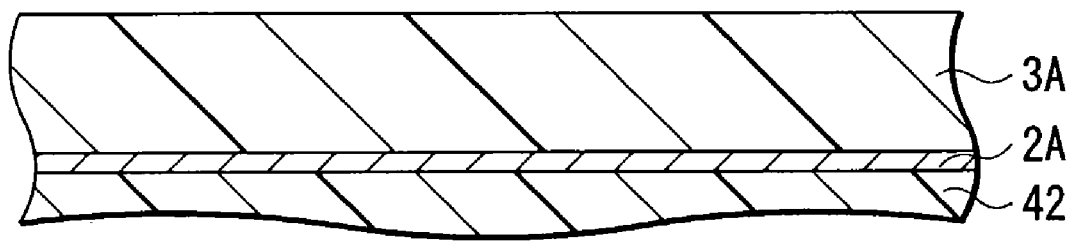
FIG. 5 is an enlarged cross section showing a process step in a method of manufacturing a thin film magnetic head according to the embodiment.

First, in the first step as shown in FIG. 5, on the photoresist layer 42 formed on the recording gap layer 41, the underfilm 2A made of a conductor such as copper (Cu), gold (Au), or platinum (Pt) is formed by a dry thin-film forming process such as sputtering or CVD.

Figure 6:
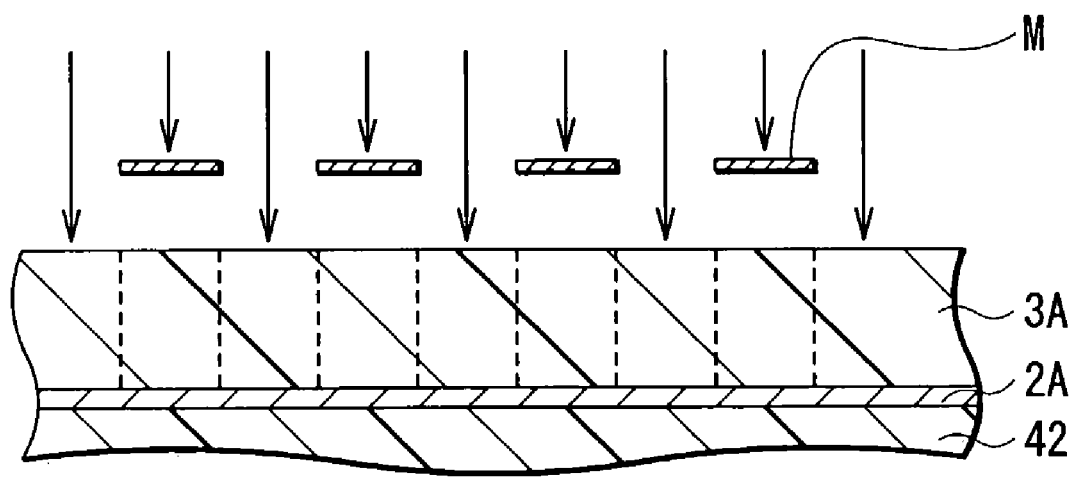
FIG. 6 is an enlarged cross section showing a process step subsequent to the process step in FIG. 5.
Figure 7:
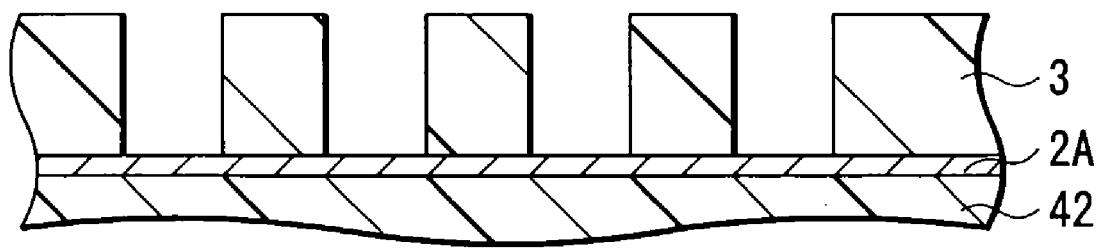
FIG. 7 is an enlarged cross section showing a process step subsequent to the process step in FIG. 6.

In the second step, a first resist layer 3A is formed by spin coating or the like by using, for example, a liquid photoresist material so as to cover the underfilm 2A. By using the liquid photoresist material, higher resolution is achieved. In this case, it is desirable to perform heating treatment by using a hot plate or the like at temperature of 110° C. for 300 seconds for the reason that, by the heating treatment, a residual solvent density in the liquid photoresist becomes moderate. Subsequently, as shown in FIG. 6, the first resist layer 3A is exposed selectively via a mask M, thereby forming a latent image. After that, the unexposed portions are dissolved and removed by using a predetermined developer. The resultant is washed with water and dried. In such a manner, as shown in FIG. 7, the first resist frame 3 having a predetermined pattern shape is formed.

Figure 8:
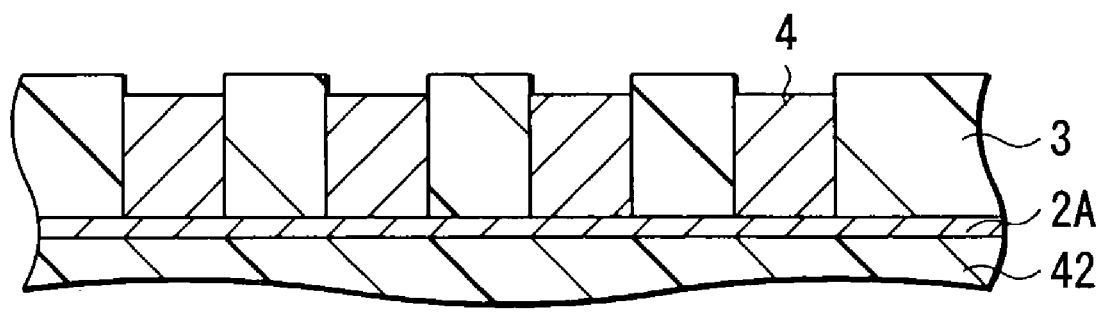
FIG. 8 is an enlarged cross section showing a process step subsequent to the process step in FIG. 7.

In the third step, as shown in FIG. 8, the first resist frame 3 is used as a mask and selective plating growth is allowed to occur by using the underfilm 2A as an electrode film, thereby forming the first conductive layer pattern 4 made of copper, gold, or platinum. It is not always necessary to make the first conductive layer pattern 4 thinner than the first resist frame 3 as shown in FIG. 8. The first conducive film pattern 4 may be formed with the same thickness as the first resist frame 3 or may be formed so as to overhang the first resist frame 3.

Figure 9:
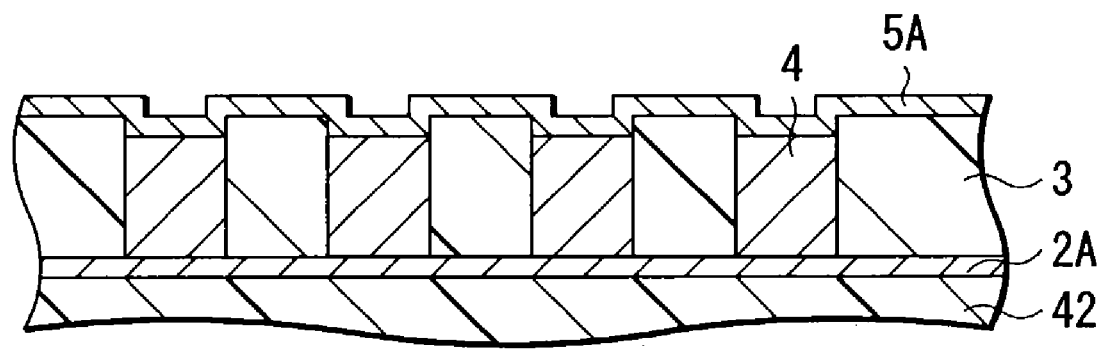
FIG. 9 is an enlarged cross section showing a process step subsequent to the process step in FIG. 8.

In the following fourth step, as shown in FIG. 9, the intermediate conductive layer 5A is formed by the dry thin-film forming process such as sputtering or CVD so as to cover the first resist frame 3 and the first conductive layer pattern 4. In this case, the intermediate conductive layer 5A may be formed by using a material having the same composition as that of at least one of the first and second conductive layer patterns 4 and 7. By the existence of the intermediate conductive layer 5A, a second resist layer 6A to be formed in the following step and the first resist frame 3 are completely separated from each other.

Figure 10:
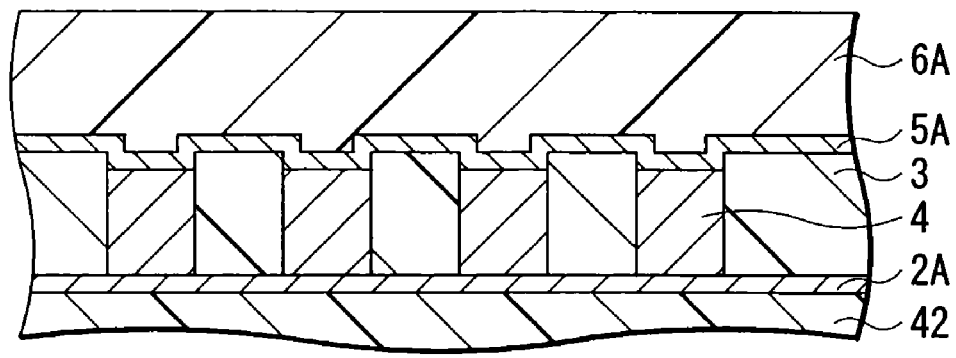
FIG. 10 is an enlarged cross section showing a process step subsequent to the process step in FIG. 9.
Figure 11:
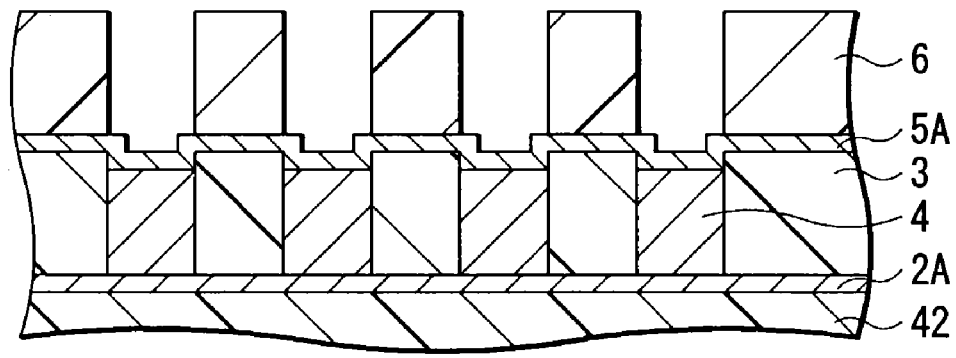
FIG. 11 is an enlarged cross section showing a process step subsequent to the process step in FIG. 10.

Further, in the fifth step, as shown in FIG. 10, the second resist layer 6A is applied by using a liquid resist by, for example, spin coating so as to cover the intermediate conductive layer 5A. Since the first resist frame 3 and the second resist layer 6A are completely separated from each other, inter-mixing does not occur. In a manner similar to the second step, it is desirable to perform the heating treatment by a hot plate or the like at temperature of 110° C. for 300 seconds. After that, the second resist layer 6A in the region corresponding to the first resist frame 3 is exposed selectively via a not-shown mask, thereby forming a latent image, and the unexposed portion is developed by using a predetermined developer. After that, the resultant is washed with water and dried. In such a manner, as shown in FIG. 11, the second resist frame 6 having a predetermined pattern shape is formed.

Figure 12:
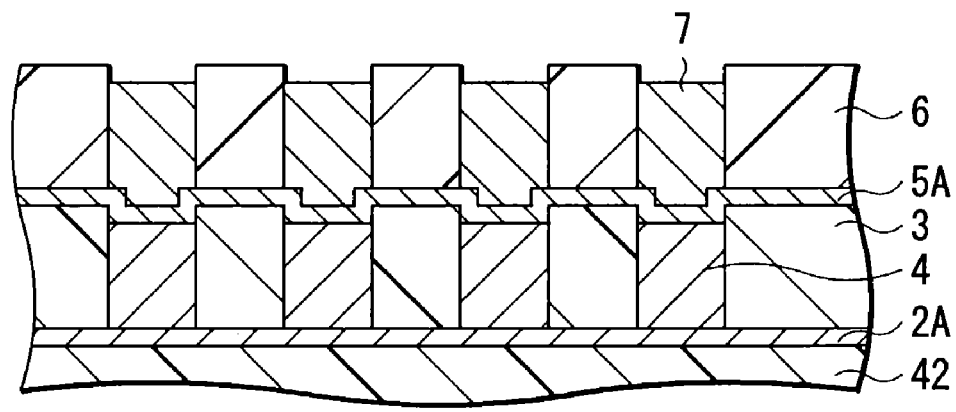
FIG. 12 is an enlarged cross section showing a process step subsequent to the process step in FIG. 11.

In the sixth step, as shown in FIG. 12, the second resist frame 6 is used as a mask and selective plating growth using the intermediate conductive layer 5A as an electrode film is allowed to occur, thereby forming the second conductive layer pattern 7 made of copper, gold, or platinum. It is not always necessary to make the second conductive layer pattern 7 thinner than the second resist frame 6 as shown in FIG. 12. The second conducive film pattern 7 may be formed with the same thickness as the second resist frame 6 or may be formed so as to overhang the second resist frame 6.

Figure 13:
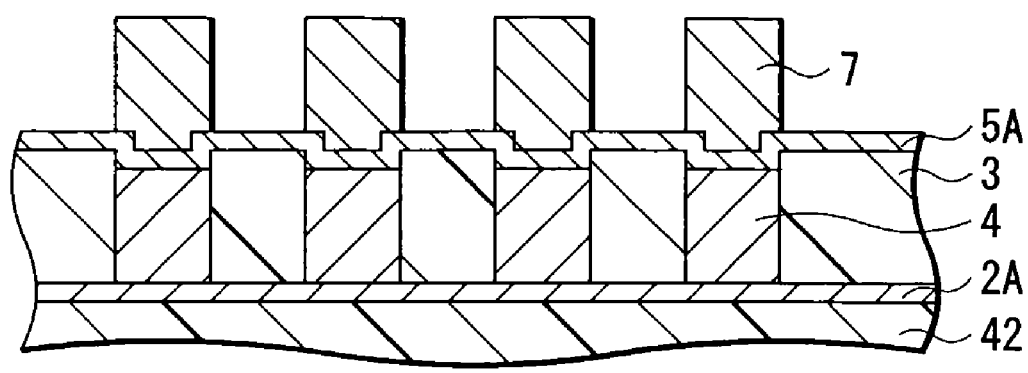
FIG. 13 is an enlarged cross section showing a process step subsequent to the process step in FIG. 12.
Figure 14:
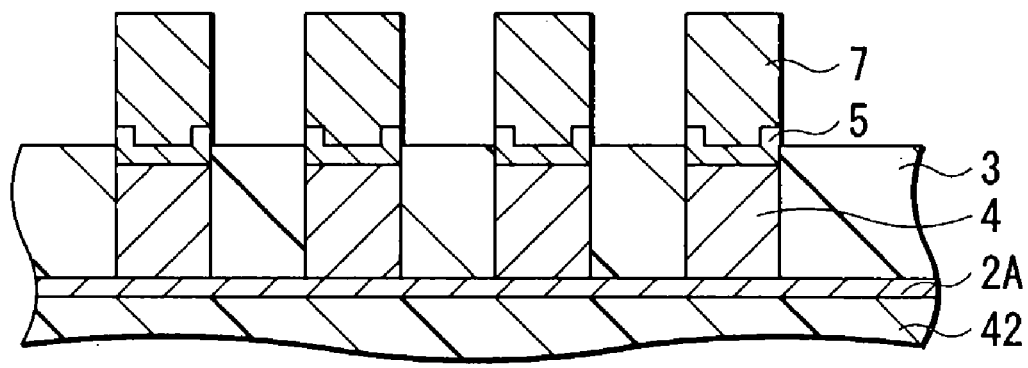
FIG. 14 is an enlarged cross section showing a process step subsequent to the process step in FIG. 13.
Figure 15:
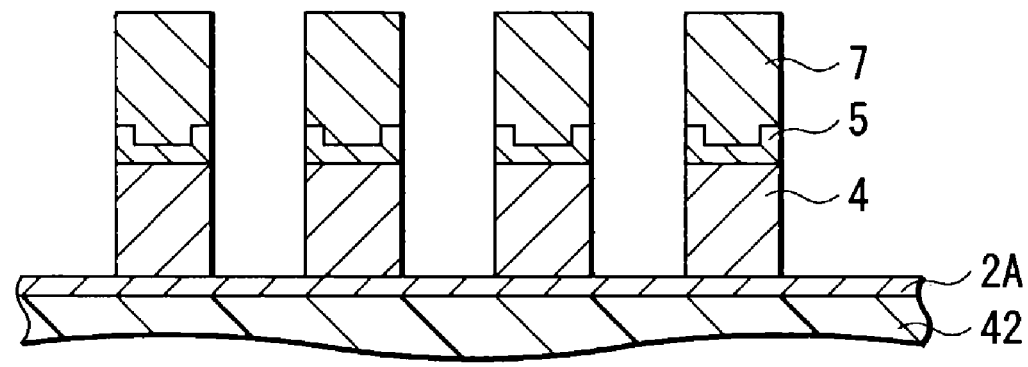
FIG. 15 is an enlarged cross section showing a process step subsequent to the process step in FIG. 14.

In the seventh step, as shown in FIG. 13, the whole is impregnated in an organic solvent of, for example, acetone and rocked, thereby dissolving and removing the second resist frame 6. Further, as shown in FIG. 14, the intermediate conductive layer 5A on the first resist frame 3 is selectively removed by using the second conductive layer pattern 7 as a mask by dry etching such as milling, wet etching, reactive ion etching (RIE), or the like. Subsequently, as shown in FIG. 15, the whole is impregnated in an organic solvent of, for example, acetone and rocked, thereby dissolving and removing the first resist frame 3. Finally, by wet etching, dry etching such as milling, RIE, or the like, the underfilm 2A is selectively removed. In such a manner, as shown in FIG. 4, the coil 43 as a conductive thin film pattern having high-precision dimensions is completed. In the above-described steps, the thickness of each of the first and second conductive layer patterns 4 and 7, underfilm 2A, and intermediate conductive layer 5A is determined in consideration of the aspect ratio (concretely, sectional area, coil pitch and the like) required for the coil 43. The aspect ratio will be described later.

Actions of the method of forming a conductive thin film pattern of the embodiment will be described while being compared with a comparative example. Each of FIGS. 17 and 18 shows a process step in a method of manufacturing a thin film magnetic head as a comparative example of the embodiment.

Figure 17:
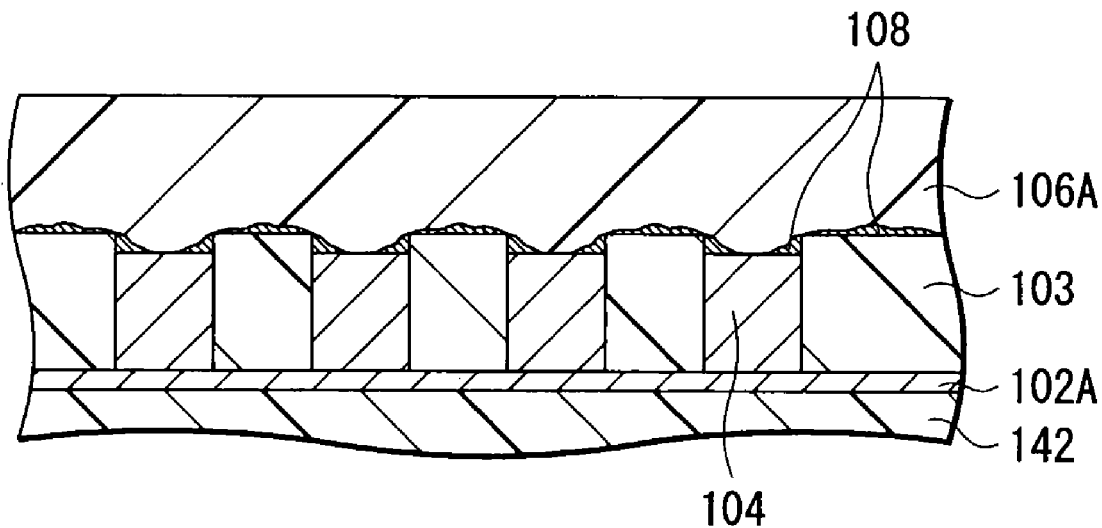
FIG. 17 is an enlarged cross section showing a process step in a method of manufacturing a thin film magnetic head as a comparative example.
Figure 18:
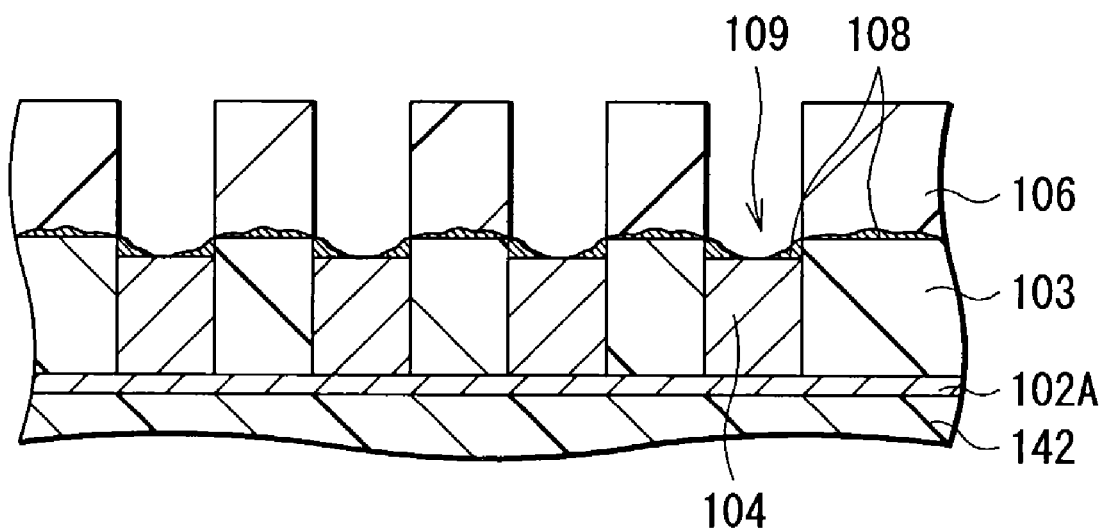
FIG. 18 is an enlarged cross section showing a process step subsequent to the process step in FIG. 17.

As shown in FIG. 17, in the comparative example, a first resist frame 103 is formed, a first conductive layer pattern 104 is plating grown by using an underfilm 102A as an electrode film and, after that, without forming an intermediate conductive layer, a second resist layer 106A is applied to the whole face by using, for example, a liquid photoresist material. When the second resist layer 106A is applied directly on the first resist frame 103 and the first conductive layer pattern 104, a part of the first resist frame 103 is diffused into the second resist layer 106A, and inter-mixing occurs between the first resist frame 103 and the second resist layer 106A. By the inter-mixing, an insoluble layer 108 which is not dissolved in a developer is formed on the interface between the first resist frame 103 and the second resist layer 106A. A part of the insoluble layer 108 flows onto the first conductive layer pattern 104 and partly covers the first conductive layer pattern 104. Consequently, as shown in FIG. 18, even when a developing process is performed on the second resist layer 106A which is selectively exposed, the insoluble layer 108 is not dissolved in a developer so that it remains on the bottom of an opening 109 of the second resist frame 106 (in other words, the top face of the first conductive layer pattern 104). Due to this, it becomes difficult to make plating growth using the first conductive layer pattern 104 as an electrode film occur. Even if plating growth can be made occur, it becomes difficult to form a conductive layer pattern which is thicker and has a high-precision dimensional shape.

In contrast, in the embodiment, as shown in FIGS. 9 and 10, in a step before the second resist layer 6A is applied, the intermediate conductive layer 5A is formed so as to cover both of the first conductive layer pattern 4 and the first resist frame 3. Because of this layer, the first resist frame 3 and the second resist layer 6A are completely separated from each other, so that inter-mixing does not occur and, therefore, an insoluble layer as described above is not formed. Consequently, plating growth using the intermediate conductive layer 5A as an electrode film occurs excellently, and the second conductive layer pattern 7 can be formed with high precision. Thus, the coil 43 thicker than that in the case of a single-layer structure and having high-precision dimensions can be easily obtained. Particularly, in the embodiment, the first and second resist frames 3 and 6 are formed by using the liquid photoresist, so that high resolution is obtained. As a result, the coil 43 having the high aspect ratio, small dimensions, and fine pitch can be formed with high precision. For example, it is easy to set the aspect ratio of 3 or higher.

Therefore, according to the embodiment, even in the case where the size in plan view of the coil 43 is sufficiently reduced, sufficient precision and coil sectional area can be assured. Therefore, the coil 43 displaying excellent conductivity can be formed, and suppression of heat generation when a current is passed to the coil and improvement in magnetic recording characteristic can be realized.

EXAMPLE

Further, a concrete example in the embodiment will be described.

In the example, the coil 43 was formed as follows on the basis of the above-described manufacturing method. The details will be described with reference to FIGS. 4 to 15.

First, as shown in FIG. 5, the underfilm 2A made of copper (Cu) was formed to thickness of about 100 nm by sputtering on the photoresist layer 42. Direct current sputtering was carried out with sputtering parameters of power of 1000W, argon (Ar) flow rate of $5.0 \times 10^{-2}$ L/min., and gas pressure of $2.7 \times 10^{-1}$ Pa.

Subsequently, by applying a liquid photoresist on the underfilm 2A by spin coating, the first resist layer 3A was formed to thickness of 50 μm. As the liquid photoresist, AZP4620 manufactured by Clariant (Japan) KK was used. After that, heat treatment was performed by a hot plate at temperature of 110° C. for 300 seconds.

After that, as shown in FIG. 6, proximity exposure (exposure performed in a state where a mask and a member to be exposed are not in contact with each other but are apart from each other with a slight distance) was made selectively by using an exposure apparatus. A dose was set to 3000 mJ/cm$^2$ and, as the mask M, a mask of a pattern having 10 turns with gaps each having a width of 35 μm at pitches of 70 μm was used. After that, by using a potassium hydroxide (KOH) aqueous solution having concentration of 0.3N (normal concentration), development was carried out by puddle method (repetition of agitation for 250 seconds ten times) and the resultant was washed with water and dried. By the operation, as shown in FIG. 7, the first resist frame 3 having a thickness of 50 μm, a width of 35 μm (interval of space is also 35 μm), and the spiral shape of ten turns was obtained. FIG. 4 and FIGS. 7 to 15 show a simplified pattern shape of only four turns.

As shown in FIG. 8, by making plating growth using the first resist frame 3 as a mask and using the underfilm 2A as an electrode film occur, the first conductive layer pattern 4 was formed. In this case, the first conductive layer pattern 4 made by a copper (Cu) film was formed so that the thickness becomes 50 μm by copper sulfate plating bathing.

Further, as shown in FIG. 9, the intermediate conductive layer 5A made of copper was formed to a thickness of about 100 nm by sputtering so as to cover the first resist frame 3 and the first conductive layer pattern 4. Sputtering parameters similar to those in the method of forming the underfilm 2A were used. To be specific, direct current sputtering was conducted with power of 1000W, argon (Ar) flow rate of $5.0 \times 10^{-2}$ L/min, and gas pressure of $2.7 \times 10^{-1}$ Pa.

After that, by applying the liquid photoresist material by spin coating so as to cover the intermediate conductive layer 5A as shown in FIG. 10, the second resist layer 6 was formed to a thickness of 50 μm. As the liquid photoresist material, AZP4620 manufactured by Clariant (Japan) KK was used. After that, heating treatment was performed by a hot plate at temperature of 110° C. for 300 seconds.

Subsequently, by using the same mask (not shown) as that used at the time of selectively exposing the first resist layer 3, proximity exposure was conducted on the second resist layer 6. The dose was set to 3000 mJ/cm$^2$. After that, by using a potassium hydroxide (KOH) aqueous solution having concentration of 0.3N (normal concentration), development was carried out by puddle method (repetition of agitation for 250 seconds by ten times) and the resultant was washed with water and dried. By the operation, as shown in FIG. 11, the second resist frame 6 having a shape equivalent to that of the first resist frame 3, that is, a shape having a thickness of 50 μm, a width of 35 μm (interval of space is also 35 μm), and the spiral shape of ten turns was obtained in the position corresponding to the first resist frame 3.

Further, as shown in FIG. 12, by making plating growth using the second resist frame 6 as a mask and using the intermediate conductive layer 5A as an electrode film occur, the second conductive layer pattern 7 was formed. In this case, the second conductive layer pattern 7 made by a copper (Cu) film was formed so that the thickness becomes 50 μm by copper sulfate plating bathing.

Further, as shown in FIG. 13, the whole was impregnated in an organic solvent of, for example, acetone and rocked, thereby dissolving and removing the second resist frame 6. Further, as shown in FIG. 14, the exposed portions of the intermediate conductive layer 5A, that is, the portions sandwiched by the first and second resist frames 3 and 6 were selectively removed by using the second conductive layer pattern 7 as a mask by milling. As milling parameters, a power of a power source was set to 500W, a current value of a power source was set to 500 mA, and a gas pressure was set to $4.0 \times 10^{-1}$ Pa. The milling angle was set to 0°, that is, milling was conducted in the direction orthogonal to the film formation face.

Subsequently, as shown in FIG. 15, the whole was impregnated in an organic solvent of, for example, acetone and rocked, thereby dissolving and removing the first resist frame 3 like the second resist frame 6. Finally, by milling, the exposed portions in the underfilm 2A were selectively removed. As milling parameters, in a manner similar to the case of selectively removing the exposed portions of the intermediate conductive layer 5, a power of a power source was set to 500W, a current value of a power source was set to 500 mA, and gas pressure was set to $4.0 \times 10^{-1}$ Pa. The milling angle was set to 0°, that is, milling was performed in the direction orthogonal to the stacked layer face.

In such a manner, as shown in FIG. 4, the coil 43 as a conductive thin film pattern having a width of 35 μm and a pattern pitch of 70 μm could be obtained.

As a result, it is understood that, according to the embodiment, the first and second resist frames 3A and 6A between which inter-mixing does not occur and by which high resolution can be obtained can be formed, and the coil 43 having a high aspect ratio, fine dimensions, and a fine pitch can be formed with high precision.

Second Embodiment

A thin film inductor to which a conductive thin film pattern according to a second embodiment of the invention is applied will now be described. The thin film inductor according to the second embodiment includes a coil as a conductive thin film pattern formed on a substrate.

First, a schematic configuration of the thin film inductor will be described hereinbelow with reference to FIGS. 4 and 16.

Figure 16:
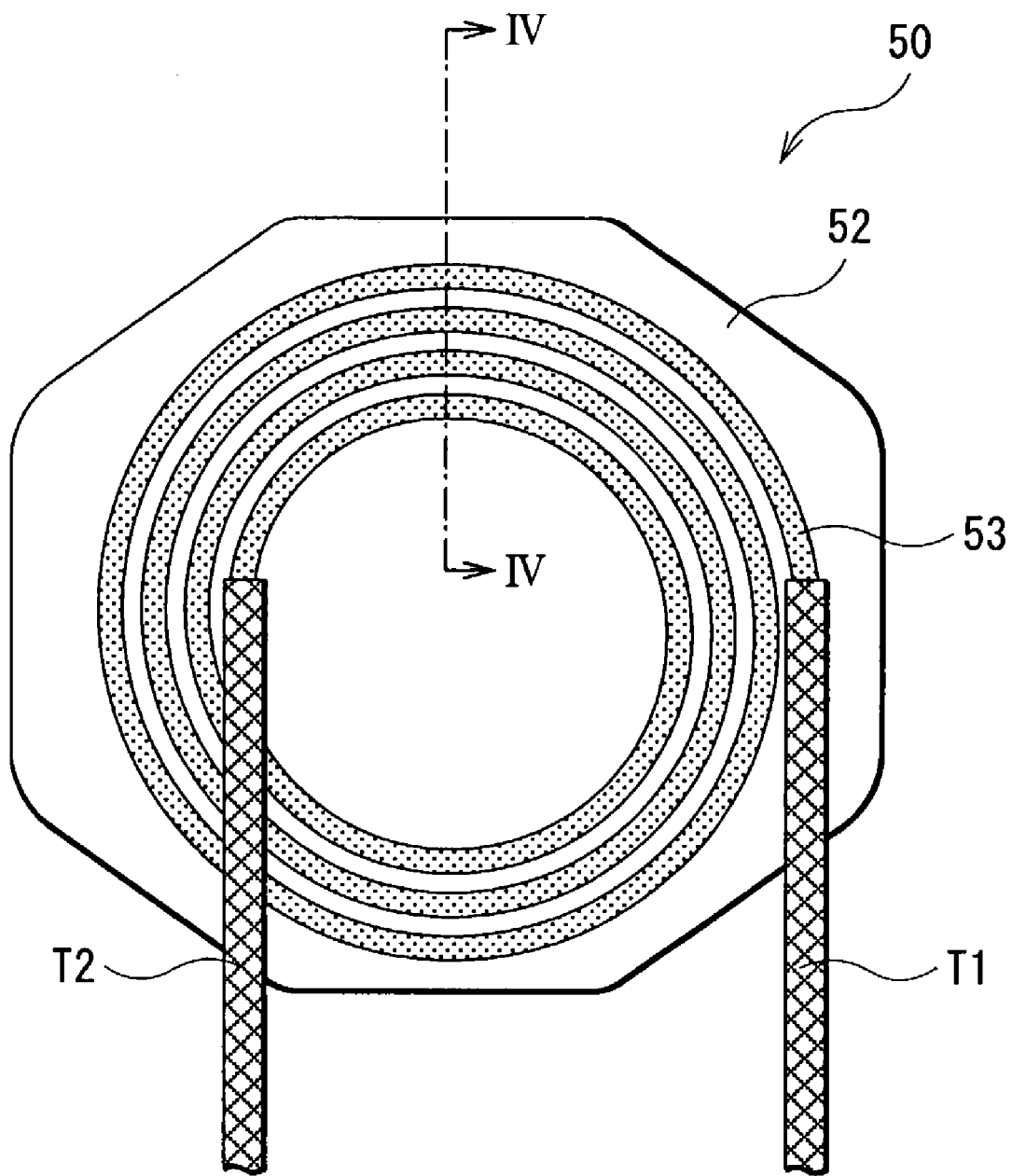
FIG. 16 is a plan view showing the configuration of a thin film inductor according to an embodiment of the invention.

FIG. 16 is a plan view showing the structure of a thin film inductor 50. A cross section taken along line IV—IV in FIG. 16 is FIG. 4. As shown in FIGS. 4 and 16, the thin film inductor 50 is obtained by forming a coil 53, a first terminal T1, and a second terminal T2 on a substrate 52. The substrate 52 is made of ferrite and has an insulating layer made of polyimide or the like on the surface. The coil 53 has a spiral shape of turns on the substrate 52. One of the two terminals of the coil 53 is connected to the first terminal T1, and the other terminal is connected to the second terminal T2. Although not shown, between the coil 53 and the first and second terminals T1 and T2, a protection film made of an insulating material formed so as to cover the whole faces of the substrate 52 and the coil 53 exists. In the protection film, through holes are formed in portions corresponding to both ends of the coil 53. Via the through holes, one end of each of the first and second terminals T1 and T2 and each of the ends (an outer circumferential end and an inner circumferential end) of the coil 53 are connected to each other. The coil 53 corresponds to an example of "conductive thin film pattern" in the invention.

As shown in FIG. 4, the coil 53 has, in a manner similar to the coil 43 in the first embodiment, the underfilm pattern 2 made of a conductor, the first conductive layer pattern 4 formed by selective plating growth using the underfilm pattern 2 as an electrode film, the intermediate conductive layer pattern 5 formed on the first conductive layer pattern 4, and the second conductive layer pattern 7 formed by selective plating growth using the intermediate conductive layer pattern 5 as an electrode film in the position corresponding to the first conductive layer pattern 4 on the intermediate conductive layer pattern 5. The coil 53 is assembled to give inductance into an electric circuit and has, by applying a magnetic action generated when a current is passed, the function of performing, for example, conversion of the voltage, control of noise, and the like.

A method of manufacturing the thin film inductor 50 will be described hereinbelow with reference to FIGS. 4 and 16.

First, the substrate 52 made of ferrite or the like having an insulating layer such as polyimide formed on the surface is prepared. On the substrate 52, the underfilm 2A is formed by using a conductor such as copper. The first resist frame 3 is selectively formed by photolithography and the like on the underfilm 2A. After that, by selective plating growth using the first resist frame 3 as a mask and using the underfilm 2A as an electrode film, the first conductive layer pattern 4 is formed. Further, the intermediate conductive layer 5A is formed so as to cover the first resist frame 3 and the first conductive layer pattern 4. Subsequently, the second resist frame 6 is selectively formed in the position corresponding to the first resist frame 3 on the intermediate conductive layer 5A. After formation of the second resist frame 6, by selective plating growth using the second resist frame 6 as a mask and using the intermediate conductive layer 5A as an electrode film, the second conductive layer pattern 7 is formed. Further, by removing the first and second resist frames 3 and 6, the intermediate conductive layer 5A in the portion sandwiched by the first and second resist frames 3 and 6, and the underfilm 2A, the coil 53 is completed.

The whole faces of the coil 53 and the substrate 52 are covered with the protection film and, after that, through holes are formed in positions corresponding to the terminal portions of the coil 53 of the protection film. Subsequently, via the through holes, one end of the first terminal T1 is connected to one end of the coil 53 and one end of the second terminal T2 is connected to the other end of the coil 53, thereby completing the thin film inductor 50.

As described above, according to the embodiment, by the selective plating growth using the first resist frame 3 as a mask and using the underfilm 2A as an electrode film, the first conductive layer pattern 4 is formed. After that, the intermediate conductive layer 5A is formed so as to cover the first resist frame 3 and the first conductive layer pattern 4 and the second resist frame 6 is selectively formed in the position corresponding to the first resist frame 3 on the intermediate conductive layer 5A. Consequently, without causing inter-mixing, the first and second resist frames 3 and 6 and the intermediate conductive layer 5A can be stacked. The coil 53 which is thicker than the case of a single-layer structure and has high precision can be obtained. Particularly, in the case of forming the first and second resist frames 3 and 6 by using the liquid photoresist, high resolution can be obtained. Therefore, the coil 53 having a high aspect ratio, fine dimensions, and a fine pitch can be formed with high precision.

According to the embodiment, therefore, even in the case where the size in plan view of the coil 53 is sufficiently reduced, sufficient precision and coil sectional area can be assured. Consequently, in spite of the large number of coil turns, the size of the whole device and the resistance value of the device can be suppressed, and heat generation when a current is passed to the coil 53 can be also suppressed. As a result, the performance of the inductor device can be improved.

Although the invention has been described by the embodiments and the modification, the invention is not limited to the embodiments and modification but can be variously modified. For example, in the foregoing embodiments and the example, the conductive thin film pattern of a two-layer structure has been described. The invention can be also applied to a conductive thin film pattern having a stacked-layer structure of three or more layers.

Further, in the embodiments and the example, the example of applying the method of forming a conductive thin film pattern to a method of manufacturing a thin film magnetic head and a thin film inductor has been described. The method can be also applied to a method of manufacturing a micro actuator such as a micro motor, an electron/magnetic device such as a semiconductor device, and a micro machine typified by a magnetic micro machine. Other examples of the micro actuator include a piezoelectric micro actuator, an ultrasonic micro actuator, an electrostatic micro actuator, and a thermal-driven type micro actuator. Other examples of the electronic/magnetic device are a thin film transformer, a thin film magnetic sensor, and various display devices. In the case of applying the manufacturing method of the embodiment to the various micro devices, heat generation in each of the micro devices can be suppressed and improvement in performance is expected.

Further, although copper, gold, or platinum is used for each of the conductive layers in the embodiments and the example, the invention is not limited to the materials. For example, a metal such as tantalum or a non-metal conductor such as ITO (Indium Tin Oxide) can be also applied.

As described above, according to the method of forming a conductive thin film pattern of the invention, before the second resist frame is formed, the intermediate conductive layer is formed so as to cover the first resist frame. Consequently, a plurality of resist frames having the same pattern shape can be stacked without causing inter-mixing. Thus, a conductive thin film pattern which is thicker as compared with the case of a single-layer structure can be formed easily with high precision.

Particularly, according to the method of forming a conductive thin film pattern of the invention, a liquid photoresist material is used, so that high resolution can be obtained. Therefore, a conductive thin film pattern having a high aspect ratio can be formed with high precision.

According to the method of manufacturing a thin film magnetic head of the invention, the method of manufacturing a thin film inductor of the invention, and the method of manufacturing a micro device of the invention, a process of forming a conductive thin film pattern includes the above-described first to seventh steps. Thus, a plurality of resist frames having the same pattern shape can be stacked without causing inter-mixing, and a conductive thin film pattern which is thicker than that in the case of a single-layer structure can be formed easily with high precision.

According to the invention, a conductive thin film pattern has a structure obtained by sequentially stacking an underfilm pattern made of a conductor, a first conductive layer pattern formed by plating growth using the underfilm pattern as an electrode film, an intermediate conductive layer pattern, and a second conductive layer pattern formed by plating growth using the intermediate conductive layer pattern as an electrode film. Consequently, a higher aspect ratio can be easily obtained as compared with a plating film pattern of a single layer structure formed without sandwiching the intermediate conductive layer pattern.

Obviously many modifications and variations of the present invention are possible in the light of the above teachings. It is therefore to be understood that within the scope of the appended claims, the invention may be practiced other wise than as specifically described.

What is claimed is:

1. A method of forming a conductive thin film pattern, comprising:
    a first step of forming an underfilm made of a conductor on a substrate;
    a second step of selectively forming a first resist frame on the underfilm;
    a third step of forming a first conductive layer pattern by selective plating growth using the first resist frame as a mask and using the underfilm as an electrode film;
    a fourth step of forming an intermediate conductive layer so as to cover the first resist frame and the first conductive layer pattern;
    a fifth step of selectively forming a second resist frame on the intermediate conductive layer in a position corresponding to the first resist frame;
    a sixth step of forming a second conductive layer pattern by selective plating growth using the second resist frame as a mask and using the intermediate conductive layer as an electrode film; and
    a seventh step of completing formation of the conductive thin film pattern by removing the first and second resist frames, the intermediate conductive layer in a position sandwiched by the resist frames, and the underfilm.

2. A method of forming a conductive thin film pattern according to claim 1, wherein in the fourth step at least the second resist frame is formed by using a liquid photoresist material.

3. A method of forming a conductive thin film pattern according to claim 1, wherein in the fourth step, the intermediate conductive layer is formed by using a material having the same composition as that of at least one of the first and second conductive layer patterns.

4. A method of forming a conductive thin film pattern according to claim 2, wherein in the fourth step, the intermediate conductive layer is formed by using a material having the same composition as that of at least one of the first and second conductive layer patterns.

5. A method of manufacturing a thin film magnetic head including a conductive thin film pattern,
    wherein a step of forming the conductive thin film pattern comprises:
    a first step of forming an underfilm made of a conductor on a substrate;
    a second step of selectively forming a first resist frame on the underfilm;
    a third step of forming a first conductive layer pattern by selective plating growth using the first resist frame as a mask and using the underfilm film as an electrode film;
    a fourth step of forming an intermediate conductive layer so as to cover the first resist frame and the first conductive layer pattern;
    a fifth step of selectively forming a second resist frame on the intermediate conductive layer in a position corresponding to the first resist frame;
    a sixth step of forming a second conductive layer pattern by selective plating growth using the second resist frame as a mask and using the intermediate conductive layer as an electrode film; and
    a seventh step of completing formation of the conductive thin film pattern by removing the first and second resist frames, the intermediate conductive layer in a portion sandwiched by the resist frames, and the underfilm.

6. A method of manufacturing a thin film magnetic head according to claim 5, wherein a thin film coil for generating a signal magnetic field for performing magnetic recording is formed by using the step of forming the conductive thin film pattern.

7. A method of manufacturing a thin film magnetic head according to claim 5, wherein a wiring pattern functioning as a conductive lead is formed by using the step of forming the conductive thin film pattern.

8. A method of manufacturing a thin film inductor including a conductive thin film pattern,
    wherein a step of forming the conductive thin film pattern comprises:
    a first step of forming an underfilm made of a conductor on a substrate;
    a second step of selectively forming a first resist frame on the underfilm;
    a third step of forming a first conductive layer pattern by selective plating growth using the first resist frame as a mask and using the underfilm as an electrode film;
    a fourth step of forming an intermediate conductive layer so as to cover the first resist frame and the first conductive layer pattern;
    a fifth step of selectively forming a second resist frame on the intermediate conductive layer in a position corresponding to the first resist frame;
    a sixth step of forming a second conductive layer pattern by selective plating growth using the second resist frame as a mask and using the intermediate conductive layer as an electrode film; and a seventh step of completing formation of the conductive thin film pattern by removing the first and second resist frames, the intermediate conductive layer in a portion sandwiched by the resist frames, and the underfilm.

9. A method of manufacturing a thin film inductor according to claim 8, wherein a wiring pattern functioning as a conductive lead is formed by using the step of forming the conductive thin film pattern.

10. A method of manufacturing a micro device including a conductive thin film pattern, wherein a step of forming the conductive thin film pattern comprises:

a first step of forming an underfilm made of a conductor on a substrate;

a second step of selectively forming a first resist frame on the underfilm;

a third step of forming a first conductive layer pattern by selective plating growth using the first resist frame as a mask and using the underfilm as an electrode film;

a fourth step of forming an intermediate conductive layer so as to cover the first resist frame and the first conductive layer pattern;

a fifth step of selectively forming a second resist frame on the intermediate conductive layer in a position corresponding to the first resist frame;

a sixth step of forming a second conductive layer pattern by selective plating growth using the second resist frame as a mask and using the intermediate conductive layer as an electrode film; and a seventh step of completing formation of the conductive thin film pattern by removing the first and second resist frames, the intermediate conductive layer in a portion sandwiched by the resist frames, and the underfilm.

11. A method of forming a thin film coil, comprising:

a first step of forming an underfilm made of a conductor on a substrate;

a second step of selectively forming a first resist frame on the underfilm;

a third step of forming a first conductive coil layer pattern by selective plating growth using the first resist frame as a mask and using the underfilm as an electrode film;

a fourth step of forming an intermediate conductive layer so as to cover the first resist frame and the first conductive coil layer pattern;

a fifth step of selectively forming a second resist frame on the intermediate conductive layer in a position corresponding to the first resist frame;

a sixth step of forming a second conductive coil layer pattern by selective plating grown using the second resist frame as a mask and using the intermediate conductive layer as an electrode film; and a seventh step of completing formation of the conductive thin film pattern by removing the first and second resist frames, the intermediate conductive layer in a position sandwiched by the resist frames, and the underfilm.

12. A method of forming a thin film coil according to claim 11, wherein in the fourth step at least the second resist frame is formed by using a liquid photoresist material.

13. A method of forming a thin film coil according to claim 11, wherein in the fourth step, the intermediate conductive layer is formed by using a material having the same composition as that of at least one of the first and second conductive coil layer patterns.

14. A method of forming a thin film coil according to claim 12, wherein the fourth step, the intermediate conductive layer is formed by using a material having the same composition as that of at least one of the first and second conductive coil layer patterns.

* * * * *